(12) United States Patent
Chen et al.

(10) Patent No.: US 8,828,245 B2
(45) Date of Patent: Sep. 9, 2014

(54) FABRICATING METHOD OF FLEXIBLE CIRCUIT BOARD

(75) Inventors: Yu-Chung Chen, Hsinchu County (TW); Yi-Ling Lo, Hsinchu (TW); Hung-Kun Lee, New Taipei (TW); Tzu-Ping Cheng, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 167 days.

(21) Appl. No.: 13/275,316

(22) Filed: Oct. 18, 2011

(65) Prior Publication Data
US 2012/0241082 A1    Sep. 27, 2012

(30) Foreign Application Priority Data
Mar. 22, 2011    (TW) .............................. 100109743 A

(51) Int. Cl.
| | | |
|---|---|---|
| H01B 13/00 | (2006.01) | |
| B44C 1/22 | (2006.01) | |
| C25D 5/12 | (2006.01) | |
| C25D 5/10 | (2006.01) | |
| C25D 5/40 | (2006.01) | |
| C25D 5/50 | (2006.01) | |
| C25D 5/02 | (2006.01) | |
| H05K 3/00 | (2006.01) | |
| C25D 5/38 | (2006.01) | |
| C25D 5/44 | (2006.01) | |
| C25D 5/36 | (2006.01) | |
| H05K 3/10 | (2006.01) | |
| H05K 3/06 | (2006.01) | |

(52) U.S. Cl.
CPC ........ *H05K 3/007* (2013.01); *C25D 5/12* (2013.01); *C25D 5/10* (2013.01); *C25D 5/40* (2013.01); *C25D 5/50* (2013.01); *C25D 5/02* (2013.01); *H05K 2201/0145* (2013.01); *H05K 2201/0154* (2013.01); *H05K 2201/0141* (2013.01); *C25D 5/38* (2013.01); *C25D 5/44* (2013.01); *H05K 3/108* (2013.01); *C25D 5/36* (2013.01); *H05K 2203/0152* (2013.01); *H05K 3/06* (2013.01); *H05K 2203/0315* (2013.01)
USPC ................... 216/13; 216/41; 216/58; 205/78; 205/80; 205/125

(58) Field of Classification Search
USPC ...................... 216/13, 41, 58; 205/78, 80, 125
See application file for complete search history.

(56) References Cited

U.S. PATENT DOCUMENTS 3,341,916 A *  9/1967 Greene ........................... 445/24
3,998,601 A   12/1976 Yates et al.
(Continued)

FOREIGN PATENT DOCUMENTS

| CN | 1294004 | 1/2007 |
| CN | 101122035 | 2/2008 |

(Continued)

OTHER PUBLICATIONS

Yamamoto et al., "Allowable copper thickness for fine pitch patterns formed by a subtractive method", Circuit World, Oct. 26, 2000, pp. 6-12, vol. 27, Issue 1.

(Continued)

*Primary Examiner* — Shamim Ahmed
(74) *Attorney, Agent, or Firm* — Jianq Chyun IP Office

(57) ABSTRACT

A fabricating method of a flexible circuit board includes the following steps. The metal carrier foil with metal oxide layer on its surfaces is provided first. The metal oxide layer is formed from the spontaneous oxidization of the metal carrier foil in ambient air and provides passive protection in a sulfuric acid solution or an acidic copper sulphate solution. A conductive seed layer is electroplated onto the metal oxide layer. A flexible insulating layer is formed onto the conductive seed layer by performing a polyimide casting process. The metal carrier foil is then peeled off from the conductive seed layer, which is supported by the insulating layer. A patterned circuit is formed on the insulating layer by performing photoresist coating, developing and etching.

15 Claims, 8 Drawing Sheets

(56) References Cited

U.S. PATENT DOCUMENTS

| | | | |
|---|---|---|---|
| 4,353,954 A * | 10/1982 | Yamaoka et al. | 428/216 |
| 5,066,366 A | 11/1991 | Lin | |
| 5,262,247 A | 11/1993 | Kajiwara et al. | |
| 5,840,170 A * | 11/1998 | Nagy | 205/101 |
| 6,346,335 B1 * | 2/2002 | Chen et al. | 428/629 |
| 6,447,929 B1 | 9/2002 | Wang et al. | |
| 6,465,742 B1 | 10/2002 | Hiraoka et al. | |
| 6,569,543 B2 | 5/2003 | Brenneman et al. | |
| 6,596,391 B2 | 7/2003 | Smith | |
| 6,689,268 B2 * | 2/2004 | Chen et al. | 205/171 |
| 6,770,976 B2 | 8/2004 | Wang et al. | |
| 2003/0111734 A1 | 6/2003 | Kobayashi et al. | |
| 2005/0142374 A1 * | 6/2005 | Chen et al. | 428/607 |
| 2009/0136725 A1 | 5/2009 | Shimokawa et al. | |
| 2010/0330504 A1 * | 12/2010 | Irisawa et al. | 430/313 |
| 2012/0155054 A1 * | 6/2012 | McColloch | 361/818 |

FOREIGN PATENT DOCUMENTS

| | | |
|---|---|---|
| CN | 101322447 | 12/2008 |
| CN | 101933408 | 12/2010 |
| JP | 2000-309898 | 11/2000 |
| JP | 2002-292788 | 10/2002 |
| JP | 2003-181970 | 7/2003 |
| JP | 2004124214 | 4/2004 |
| JP | 2005-307270 | 11/2005 |
| JP | 2007-186781 | 7/2007 |
| JP | 2007-314855 | 12/2007 |
| JP | 2009-004423 | 1/2009 |
| JP | 2009-090570 | 4/2009 |
| TW | I263461 | 10/2006 |
| TW | I276708 | 3/2007 |
| TW | 200806810 | 2/2008 |
| TW | 200939920 | 9/2009 |

OTHER PUBLICATIONS

Sakairi et al., "Effect of Potential, Temperature, and Fluoride Ions on the Repassivation Kinetics of Titanium in Phosphate Buffered Saline Solution with the Photon RuptureMethod", Laser Chemistry, May 5, 2009, pp. 1-8.

Abdel-Gaber et al., "Kinetics and thermodynamics of aluminium dissolution in 1.0M sulphuric acid containing chloride ions", Materials Chemistry and Physics, Sep. 7, 2005, pp. 291-297.

Go Okamoto, "Passive Film of 18-8 Stainless Steel Structure and Its Function", Corrosion Science, 1973, pp. 471-489, vol. 13.

Abreu et al., "The effect on Ni in the electrochemical properties of oxide layers grown on stainless steels", Electrochimica Acta, 2006, pp. 2991-3000.

Cheskis et al., "Ultra Thin Copper Foil for HDI Applications", Circuit Tree, Nov. 1, 2004, pp. 1-17.

"Notice of Allowance of Taiwan Counterpart Application", issued on Aug. 16, 2013, p. 1-p. 3.

"Office Action of China Counterpart Application", issued on Jun. 4, 2014, p. 1-p. 5.

* cited by examiner

FABRICATING METHOD OF FLEXIBLE CIRCUIT BOARD

CROSS-REFERENCE TO RELATED APPLICATION

This application claims the priority benefit of Taiwan application serial no. 100109743, filed on Mar. 22, 2011. The entirety of the above-mentioned patent application is hereby incorporated by reference herein and made a part of this specification.

BACKGROUND

1. Technical Field

The technical field relates to a flexible circuit board, more particularly to a ultrafine circuit applicable in a flexible circuit board.

2. Related Field

Nowadays, most of the flexible circuit boards are fabricated by subtractive process, in which a photoresist (PR) is first coated onto a flexible copper clad laminate. Subsequent to the exposure and development processes, the required circuit pattern is transferred to the photoresist. The patterned photoresist is then used as a mask and wet etching is performed on the copper clad layer to form a circuit having the required pattern on the flexible substrate. However, affected by side etching, the copper circuit may have a trapezoid cross-sectional profile. The adverse effect of side etching is exacerbated with the increase in thickness of the copper foil layer or the fineness of the line width. In certain serious situations, an inverted triangle cross-sectional profile can happened to the copper circuit, and then make the subsequent configuration of devices become difficult, and poor signal transmission and reduction of the product yield. Therefore, for matching the trend of continuous thinning, lighting and down-sizing of electronic products, a further reduction of line width will require the application of a thinner copper layer. However, when the thickness of the copper layer is too thin (<8 μm), a parasitic copper rigidity—handability problem will make the manufacturing process become more difficult.

In order to improve the above mentioned handability of the thinner foil, wherein the application of the most popular subtractive process can be continued. A copper foil attached with carrier (hereafter named carrier-attached copper foil in abbreviation) has been developed through a support of carrier film with more rigidity and releasable capability after high temperature lamination processing. However, the highest operation temperature for the currently commercially available carrier-attached copper foil is only 300° C., which is still not enough for the high temperature and long duration (>360° C. for 1 hour) requirement of polyimide casting process. Moreover, even after being separated, the carrier foil is not usable again. Accordingly, by now, a carrier-attached copper foil is still expensive and unpopular. As a result, for the fabrication of LCD-COF (Chip On Flex), in which highly fine pattern is demanded, the industry generally uses the imported flexible copper clad laminate formed by sputtering process. A sputtering processed product, attributed to its necessity of passing a vacuum process, is not only expensive, but also parasitic with some undesirable properties, such as low peeling strength and low thermal stability, which would hinder the further development of fine pattern flexible circuit. Accordingly, the development of a carrier-attached copper foil remains an attention focus in the industry.

SUMMARY

An exemplary embodiment of the disclosure provides a fabrication method of a flexible circuit board, in which ultrafine circuit is provided and low production cost is achieved.

An exemplary embodiment of the disclosure provides a fabrication method of a flexible circuit board which includes at least the following process steps. A metal carrier foil is provided. The surface of the metal carrier foil includes a metal oxide layer, and the metal oxide layer is comprised of the oxidation product of the metal carrier foil. Electroplating is performed on the metal oxide layer to form a conductive seed layer. After casting an organic insulating material or its precursor resin solution onto the conductive seed layer, followed by a baking and a hardening process, a flexible organic insulating layer is formed. The metal carrier foil is then peeled at the interface between the metal carrier foil and the conductive seed layer. The resulting seed layer and the insulating layer together form a flexible metal clad laminate. A patterned circuit is then formed on the flexible metal clad laminate.

Another exemplary embodiment of the disclosure provides a fabrication method of a flexible circuit board which includes at least the following process steps. A metal carrier foil is provided. The surface of the metal carrier foil includes a metal oxide layer, and the metal oxide layer is comprised of the oxidation product of the metal carrier foil. Electroplating is performed on the metal oxide layer to form a copper layer used for forming a circuit pattern. A thermal barrier layer is electroplated onto the copper layer. After casting an organic insulating material or its precursor resin solution (such as polyimide) onto the thermal barrier layer, followed by a baking and a hardening process, a flexible organic insulating layer is formed. The metal carrier foil is peeled off at the interface between the metal carrier foil and the copper layer to complete the fabrication of a flexible copper clad laminate. After further patterning the copper layer and the thermal barrier layer, a flexible circuit board can be made.

According to an exemplary embodiment of the fabrication method of a flexible circuit board of the disclosure, the metal oxide on the surface of the metal carrier foil allows the metal carrier foil to be easily peeled off subsequent to the high temperature casting process for forming the flexible insulating substrate. Accordingly, the fabrication method of a flexible circuit of the exemplary embodiments of the disclosure is applicable to the high temperature production (400° C. for 2 hours) of flexible metal clad laminate with the ultrathin (<8 μm) metal layer for producing an ultrafine flexible circuit.

The disclosure and certain merits provided by the disclosure can be better understood by way of the following exemplary embodiments and the accompanying drawings, which are not to be construed as limiting the scope of the disclosure.

DETAILED DESCRIPTION OF DISCLOSED EMBODIMENTS

Figure 1A:
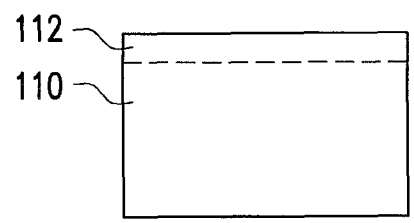
FIGS. 1A to 1H are cross-sectional view diagrams illustrating a fabrication flow of a flexible circuit board according to an exemplary embodiment of the disclosure.

FIGS. 1A to 1H are cross-sectional view diagrams illustrating a fabrication flow of a flexible circuit board according to an exemplary embodiment of the disclosure. As shown in FIG. 1A, a metal carrier foil 110 is provided. The surface of the metal carrier foil 110 includes a metal oxide layer 112, and the metal oxide layer 112 is comprised of oxidation product of the metal carrier foil 110. The metal carrier foil 110 mainly includes a metal material from which an oxide layer with a compact surface may form through spontaneous oxidation of the metal carrier foil 110 in the ambient air, capable of providing passive protection in a sulfuric acid solution while still being conductive. The material of the metal carrier foil 110 includes, for example, stainless steel, titanium, aluminum, chromium, nickel, or alloys thereof. A stainless steel metal carrier foil 110 includes, for example, nickel alloyed 200 or 300 series austenitic stainless steel formed by rolling process. The thickness of the metal carrier foil 110 is, for example, 10 microns to 200 microns. The surface roughness ($Rz_{jis}$) of the metal carrier foil 110 is less than 1 micron, for example.

Figure 1B:
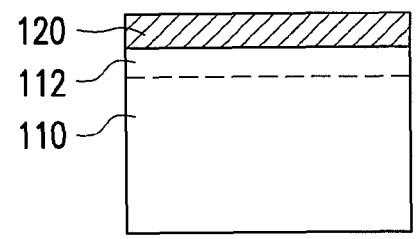

Continuing to FIG. 1B, after providing the metal carrier foil 110 as shown in FIG. 1A, a conductive seed layer 120 is electroplated onto the metal oxide layer 112. The material of the conductive seed layer 120 includes nickel, chromium, cobalt, molybdenum, zinc, tungsten, aluminum, copper, other appropriate metals, or alloys thereof. Further, the conductive seed layer 120 may be a single layer or a multi-layer structure. The thickness of the conductive seed layer 120 is less than 2 microns. When the material of the patterned circuit 152 is copper, the conductive seed layer 120 serves to prevent copper migration. When necessary, a nodulization treatment and adhesion-enhancing treatment can be performed in sequence onto the surface of the conductive seed layer 120.

Figure 1C:
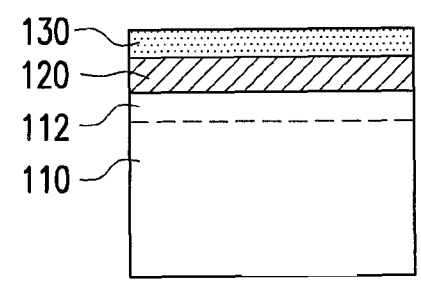

Referring to FIG. 1C, a flexible insulating layer 130 is formed onto the conductive seed layer 120. The material of the flexible insulating layer 130 includes a thermosetting material, such as epoxy, polyimide, etc., or a thermoplastic material, such as thermoplastic polyimide (TPPI), liquid crystal polymer (LCP), polyethylene terephthalate (PET), etc. The flexible insulating layer 130 serves as a support substrate for the subsequent flexible circuit layer. The flexible insulating layer 130 is typically formed by casting an organic insulating material or its precursor resin solution onto the conductive seed layer 120, followed by a baking and a hardening process. The thickness of the insulating layer 130 is about 20 microns to 60 microns, for example. In one exemplary embodiment, a polyimide insulating layer 130 is formed by casting process followed with a high temperature cyclization at about 365° C. for about one hour. Thereafter, the metal carrier foil 110 is peeled from the conductive seed layer 120 at the interface between the conductive seed layer 120 and the metal carrier foil 110. Since a deposition of a releasable layer is not required for the metal carrier foil 110 in the exemplary embodiment of the disclosure, the metal carrier foil 110 is recyclable and accordingly, the production cost is reduced.

Figure 1D:
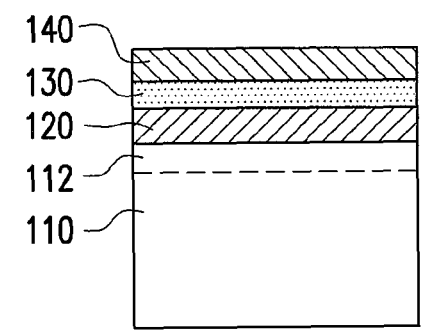
Figure 1E:
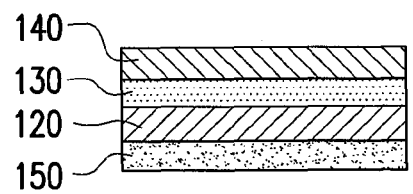
Figure 1F:
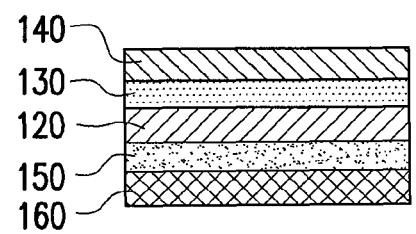
Figure 1G:
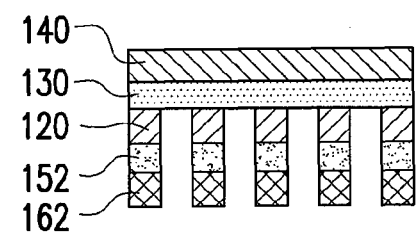
Figure 1H:
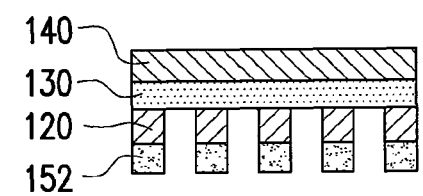

Referring to FIG. 1H, a patterned circuit 152 is formed on the conductive seed layer 120. Since the metal layer used for patterned circuit 152 is formed after the fabrication of the insulating layer 130, grain coarsening of the metal layer of the patterned circuit 152 created by the high temperature cyclization operation is mitigated. Further, the problem of disconnection, which easily occurs during the patterning of the metal layer with grain coarsening, is reduced.

According to the fabrication method of a flexible circuit board in the exemplary embodiments of the disclosure, with the application of the metal carrier foil 110 comprising a metal oxide layer 112, a releasable layer is not required. The metal carrier foil 110 can be recycled to lower the production cost. Moreover, the patterned circuit 152 is formed after the high temperature cyclization formation of the insulating layer 130, the achievability and the yield of fine circuit pattern are enhanced.

Thereafter, referring to FIG. 1D, after forming the insulating layer 130, a pliable releasable backing layer 140 may be optionally adhered to the insulating layer 130. The material of the backing layer 140 includes polyethylene terephthalate or other suitable materials, for example. The releasable backing layer 140 serves to reinforce the firmness of the insulating layer 130. Accordingly, tearing or excessive curling of the conductive seed layer 120 and the insulating layer 130, because these layers are not sufficiently firm when the metal carrier foil 110 is being peeled, is prevented.

Referring to FIG. 1E, a metal layer 150 is electroplated onto the conductive seed layer 120. The thickness of the metal layer 150 is, for example, 0.1 micron to 18 microns, and the material of the metal layer 150 is, for example, copper or other appropriate materials. In an exemplary embodiment of the disclosure, the metal layer 150 is formed by electroplating with the conductive seed layer 120 as the seed. In one exemplary embodiment, a degreasing process is performed on the surfaces of the conductive seed layer 120 and the insulating layer 130. Thereafter, the conductive seed layer 120 and the insulating layer 130 are placed in a copper phyrophosphate plating solution (composition: 40 g/liter of copper phyrophosphate, 290 g/liter of potassium phyrophosphate and 0.05 g/liter sodium dodecyl sulfonate), and a current with a current density of 1 amp/dm$^2$ is passed through a cathode to form a copper foil with a thickness of 1 micron. Thereafter, the conductive seed layer and the insulating layer are placed in an acidic copper sulfate plating solution (composition: 80 g/liter of sulfuric acid, 40 g/liter of copper ions ($Cu^{2+}$), and 36 ppm of chlorine ions ($Cl^-$)), and a current with a current density of 4 amp/dm$^2$ is passed through a cathode to form a copper foil with a thickness of 7 microns. The total thickness of the copper foil is 8 microns.

Referring to FIG. 1F, the metal layer 150 is adhered or coated with a photoresist layer 160. The photoresist layer 160 is then patterned to form a patterned photoresist 162, as shown in FIG. 1G. Further referring to FIG. 1G, using the patterned photoresist 162 as a mask, the metal layer 150 and the conductive seed layer 120 are etched, as shown in FIG. 1F, to form a patterned circuit 152. Referring to FIG. 1H, the patterned photoresist 162 is removed, and the patterned circuit 152 is finished. In this way, if the thickness of the metal layer 150 formed in the step of FIG. 1E is 8 microns, the effective pitch of the final metal layer 150 can be controlled at about 22 microns.

Figure 2A:
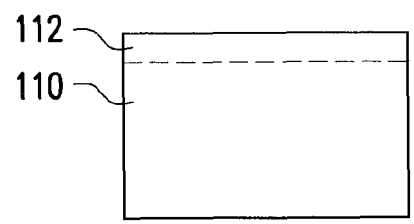
FIGS. 2A to 2I are cross-sectional view diagrams illustrating a fabrication flow of a flexible circuit board according to another exemplary embodiment of the disclosure.
Figure 2B:
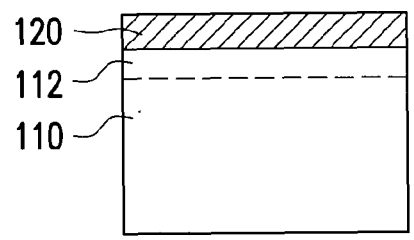
Figure 2C:
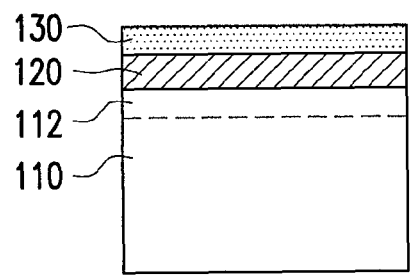
Figure 2D:
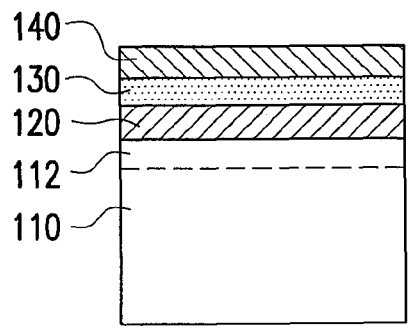
Figure 2E:
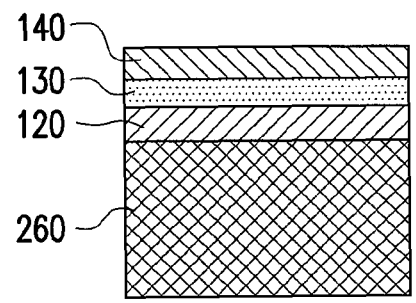
Figure 2F:
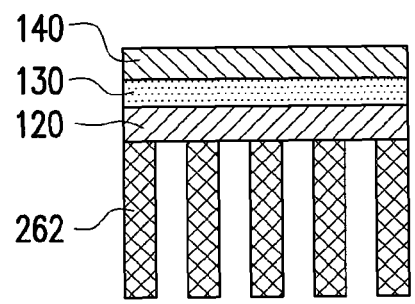
Figure 2G:
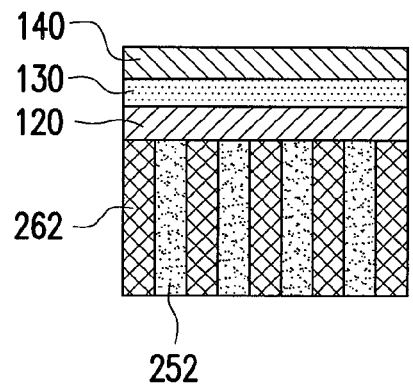
Figure 2H:
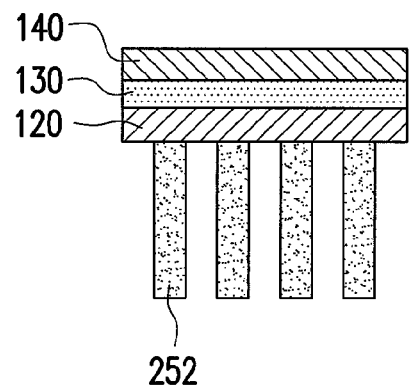
Figure 2I:
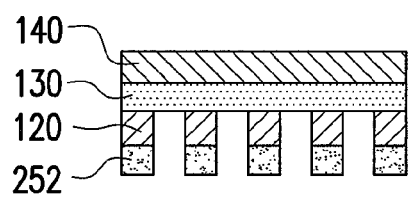

FIGS. 2A to 2I are cross-sectional view diagrams illustrating a fabrication flow of a flexible circuit board according to another exemplary embodiment of the disclosure. The early process steps of the fabrication of a flexible circuit board in this exemplary embodiment as shown in FIGS. 2A to 2D are similar to the process steps depicted in FIGS. 1A to 1D; accordingly, the details thereof will not be further discussed herein. Continuing to FIG. 2E, after the metal carrier foil 110 is peeled off (as illustrated in FIG. 2D), the conductive seed layer 120 is adhered or coated with a layer of photoresist 260. The photoresist 260 is patterned to form a patterned photoresist 262, as shown in FIG. 2F. Thereafter, referring to FIG. 2G, a patterned circuit 252 is formed onto the portion of the conductive seed layer 120, not covered by the patterned photoresist 262. In this exemplary embodiment, the patterned circuit 252 is formed by electroplating using the conductive seed layer 120 as the seed. Referring to FIG. 2H, the patterned photoresist layer 262, as shown in FIG. 2G, is removed. Ultimately, as shown in FIG. 2I, the conductive seed layer 120 is etched using the patterned circuit 252 as a mask to complete the fabrication of the required patterned circuit 252. With this approach, assuming the thickness of the patterned circuit 252 formed in the step as shown in FIG. 2G, is 8 microns, the effective pitch of the ultimately formed pattern circuit 252 is controlled to be 10 microns.

Figure 3A:
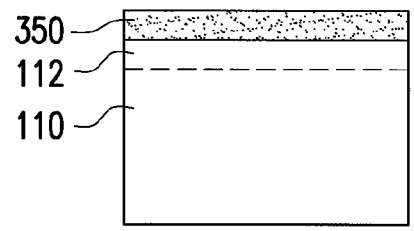
FIGS. 3A to 3H are cross-sectional view diagrams illustrating a fabrication flow of a flexible circuit board according to another exemplary embodiment of the disclosure.

FIGS. 3A to 3H are cross-sectional view diagrams illustrating a fabrication flow of a flexible circuit board according to another exemplary embodiment of the disclosure. Referring to FIG. 3A, a metal layer 350 used in forming the circuit is electroplated onto the metal oxide layer 112 on the surface of the metal carrier foil 110. The metal carrier foil 110 and the metal oxide layer 112 are similar to the metal carrier foil 110 and metal oxide layer 112 in FIG. 1A, and the detail description thereof is omitted herein. The material and the fabrication method of the metal layer 350 may refer to those of the metal layer 150 in FIG. 1E.

Figure 3B:
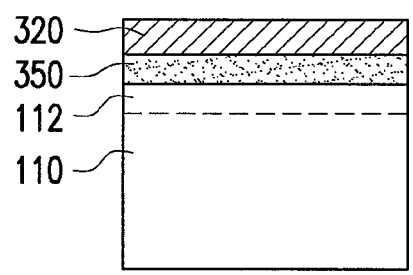

Referring to FIG. 3B, after the metal layer 350 is formed, as shown in FIG. 3A, a thermal barrier layer 320 is electroplated onto the metal layer 350. The material of the thermal barrier layer 320 includes, but not limited to, nickel, chromium, cobalt, molybdenum, zinc, tungsten, aluminum, copper, other appropriate metals, or alloys thereof. The thermal barrier layer 320 may be a single layer or a multi-layer structure. The thickness of the thermal barrier layer 320 is less than 2 microns.

Figure 3C:
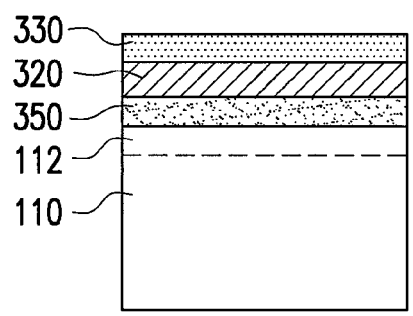

Continuing to FIG. 3C, an insulating layer 330 is formed onto the thermal barrier layer 320. The material of the insulating layer 330 is similar to the material of the insulating layer 130 in FIG. 1C.

Figure 3D:
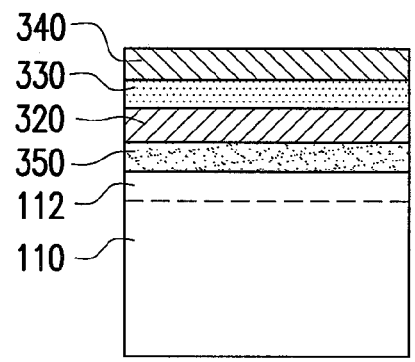
Figure 3E:
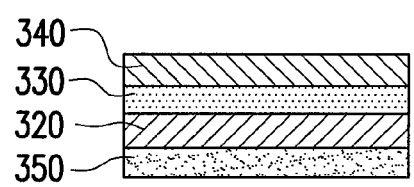

Referring to FIG. 3E, the metal carrier foil 110 as shown in FIG. 3C is peeled off from the metal layer 350 at the interface between the metal layer 350 and the metal carrier foil 110. Thereafter, as shown in FIG. 3H, the metal layer 350 and the thermal barrier layer 320, as shown in FIG. 3E, are patterned to form a patterned circuit 352.

According to the above, the exemplary embodiments of the disclosure, a releasable layer is not required for the metal carrier foil 110 comprising the metal oxide layer 112 in the fabrication of a flexible circuit board. Further, the metal carrier foil 110 is recyclable to lower the production cost.

Referring to FIG. 3D, after forming an insulating layer 330 as shown in FIG. 3C, a releasable backing layer 340, which is similar to the backing layer 140 in FIG. 1D, may be optionally adhered to the insulating layer 330.

Figure 3F:
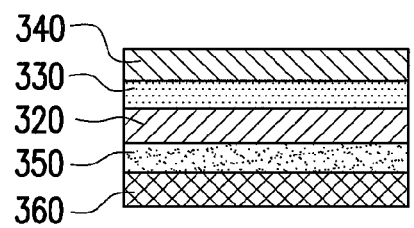
Figure 3G:
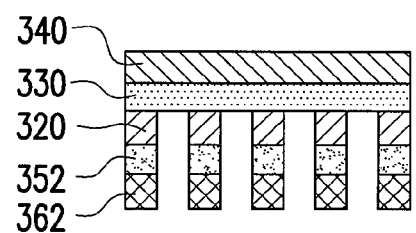
Figure 3H:
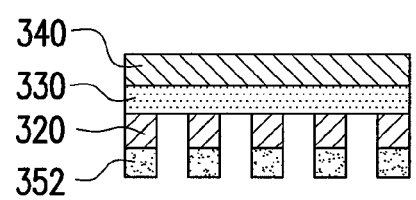

Referring to FIG. 3F, a photoresist 360 is adhered or coated on the metal layer 350. The photoresist 360 is then patterned to form a patterned photoresist 362 as shown in FIG. 3G. Still referring to FIG. 3G, the patterned photoresist 362 is used as a mask, and the metal layer as shown in FIG. 3F is etched to form a patterned circuit 352. Further, the thermal barrier layer 320 is also etched away during the etching of the metal layer 350. The patterned photoresist 362 is subsequently removed to form the patterned circuit 352, as shown in FIG. 3H. With this approach, the effective pitch of the ultimately formed patterned circuit 352 can be controlled to about 30 microns when the thickness of the metal layer 350 formed in the process step as shown in FIG. 3A is 8 microns.

In the following experiments, a flexible circuit board is fabricated according the fabrication method as shown in FIGS. 3A to 3H. In one experiment, the material of the metal carrier foil is titanium, for example. Further, prior to the peeling process, the titanium carrier attached copper foil is annealed at 400° C. for 2 hours. The resulting peel strength is maintained at 17 to 50 g/cm. In another experiment, the material of the metal carrier foil is aluminum. Prior to the peeling process, the aluminum carrier attached copper foil is subjected to an annealing at 400° C. for 2 hours, and the resulting peel strength is maintained at 75.5 g/cm. In yet another experiment, the material of the metal carrier foil is SUS 304 stainless steel. Prior to the peeling process, the SUS carrier attached copper foil is subjected to polyimide cyclization treatment at 365° C. for 1 hour. The resulting peel strength is controlled to 10 to 40 g/cm. The results confirm that the fabrication method of a flexible circuit board as disclosed in the exemplary embodiments not only can provide ultrafine wiring, but also the metal carrier foil is recyclable to lower the cost.

According to the fabrication method of a flexible circuit board of the exemplary embodiments, a releasable layer is not required for the metal carrier foil. Hence, by providing an appropriate support for the ultra-thin metal layer, an ultrafine pattern circuit can be completed. Moreover, after cyclization process, the peeled metal carrier foil still can be recycled to lower the cost. Furthermore, the step in forming the circuit with the appropriate metal layer is performed subsequent to the high temperature cyclization process for forming the insulating layer. Accordingly, grain coarsening of the metal layer is reduced, while the yield of the circuit is greatly enhanced. The application of the fabrication method in the exemplary embodiments of the disclosure in the fabrication of flexible circuit provides beneficial and favorable results.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A fabrication method of a flexible circuit board, the fabrication method comprising:
   providing a metal carrier foil, wherein a surface of the metal carrier foil comprises a metal oxide layer, and the metal oxide layer is formed by oxidizing the metal carrier foil;
   forming a conductive seed layer on the metal oxide layer by electroplating;
   forming a flexible organic insulating layer by casting an organic insulating material or a resin solution of a precursor of the organic insulating material on the conductive seed layer, followed by performing a baking process and a hardening process;
   attaching a pliable insulating backing layer to the flexible organic insulating layer after the step of forming the flexible organic insulating layer;
   peeling off the metal carrier foil at an interface between the metal carrier foil and the conductive seed layer; and
   forming a patterned circuit on the conductive seed layer.

2. The fabrication method of a flexible circuit board of claim 1, wherein the step of forming the patterned circuit on the conductive seed layer comprises:
   electroplating a metal layer used for forming a circuit on the flexible organic insulating layer using the conductive seed layer as a seed;
   forming a patterned photoresist on the metal layer used for forming the circuit;
   etching the metal layer used for forming the circuit and the conductive seed layer to form the patterned circuit; and
   removing the patterned photoresist.

3. The fabrication method of a flexible circuit board of claim 1, wherein the step of forming the patterned circuit on the conductive seed layer comprises:
   forming a patterned photoresist on the conductive seed layer;
   performing electroplating on a portion of the conductive seed layer not covered by the patterned photoresist to form the patterned circuit;
   removing the patterned photoresist; and
   etching the conductive seed layer using the patterned photoresist as a mask.

4. The fabrication method of a flexible circuit board of claim 1, wherein a material of the conductive seed layer comprises at least one of nickel, chromium, cobalt, molybdenum, zinc, tungsten, aluminum, copper, and alloys thereof, and a thickness of the conductive seed layer is less than 2 microns.

5. The fabrication method of a flexible circuit board of claim 1, wherein the pliable insulating backing layer is constituted with a material comprising polyethylene terephthalate (PET).

6. The fabrication method of a flexible circuit board of claim 1, wherein the metal carrier foil is constituted with a material comprising stainless steel, titanium, aluminum, chromium, nickel, or alloys thereof.

7. The fabrication method of a flexible circuit board of claim 1, the insulating material is constituted with a material comprising polyimide (PI) or liquid crystal polymer (LCP).

8. The fabrication method of a flexible circuit board of claim 1, wherein the metal carrier foil is about 10 microns to about 200 microns thick, and a surface roughness of the metal carrier foil is less than 1 micron.

9. A fabrication method of a flexible circuit board, the fabrication method comprising:
   providing a metal carrier foil, wherein a surface of the metal carrier foil comprises a metal oxide layer, and the metal oxide layer is formed by oxidizing the metal carrier foil;
   electroplating a metal layer onto the metal oxide layer;
   electroplating a thermal barrier layer onto the metal layer;
   forming a flexible organic insulating layer by casting an organic insulating material or a resin solution of a precursor of the organic insulating material on the thermal barrier layer, followed by performing a baking process and a hardening process;
   attaching a pliable insulating backing layer to the flexible organic insulating layer after the step of forming the flexible organic insulating layer;
   peeling off the metal carrier foil at an interface between the metal layer and the metal carrier foil; and
   patterning the metal layer and the thermal barrier layer to form a patterned circuit.

10. The fabrication method of a flexible circuit board of claim 9, wherein the step of forming the patterned circuit comprises:
    forming a patterned photoresist on the metal layer;
    etching the metal layer and the thermal barrier layer to form the patterned circuit using the patterned photoresist as a mask; and
    removing the patterned photoresist.

11. The fabrication method of a flexible circuit board of claim 9, wherein the thermal barrier layer is constituted with a material comprising at least one of nickel, chromium, cobalt, molybdenum, zinc, tungsten, aluminum, copper, and alloys thereof, and a thickness of the thermal barrier layer is less than 2 microns.

12. The fabrication method of a flexible circuit board of claim 9, wherein the pliable insulating backing layer is constituted with a material comprising polyethylene terephthalate (PET).

13. The fabrication method of a flexible circuit board of claim 9, wherein the metal carrier foil is constituted with a material comprising stainless steel, titanium, aluminum, chromium, nickel, or alloys thereof.

14. The fabrication method of a flexible circuit board of claim 9, the flexible organic insulating material is constituted.

15. The fabrication method of a flexible circuit board of claim 9, wherein the metal carrier foil is about 10 microns to about 200 microns thick, and a surface roughness of the metal carrier foil is less than 1 micron.

\* \* \* \* \*